United States Patent
Swedberg

(10) Patent No.: US 9,160,086 B2
(45) Date of Patent: Oct. 13, 2015

(54) ELECTRICAL CONNECTORS FOR USE WITH PRINTED CIRCUIT BOARDS

(71) Applicant: IDEAL Industries, Inc., Sycamore, IL (US)

(72) Inventor: Benjamin David Swedberg, Sycamore, IL (US)

(73) Assignee: IDEAL Industries, Inc., Sycamore, IL (US)

( * ) Notice: Subject to any disclaimer, the term of this patent is extended or adjusted under 35 U.S.C. 154(b) by 0 days.

(21) Appl. No.: 14/591,637

(22) Filed: Jan. 7, 2015

(65) Prior Publication Data

US 2015/0118872 A1    Apr. 30, 2015

Related U.S. Application Data

(63) Continuation of application No. 13/713,987, filed on Dec. 13, 2012, now Pat. No. 8,961,192.

(60) Provisional application No. 61/570,506, filed on Dec. 14, 2011.

(51) Int. Cl.
   *H01R 12/51*   (2011.01)
   *H01R 12/52*   (2011.01)
   *H01R 12/73*   (2011.01)

(52) U.S. Cl.
   CPC .............. *H01R 12/515* (2013.01); *H01R 12/52* (2013.01); *H01R 12/523* (2013.01); *H01R 12/732* (2013.01)

(58) Field of Classification Search
   CPC .. H01R 9/096; H01R 23/722; H01R 23/7073; H01R 4/4818; H01R 4/4827; H01R 4/4836
   See application file for complete search history.

(56) References Cited

U.S. PATENT DOCUMENTS

| | | | | |
|---|---|---|---|---|
| 3,591,834 A * | 7/1971 | Kolias | .......................... | 361/791 |
| 4,995,814 A * | 2/1991 | Weidler | .......................... | 439/61 |
| 6,428,343 B1 * | 8/2002 | Landis et al. | ................. | 439/441 |
| 7,045,891 B2 * | 5/2006 | Choi | ............................. | 257/723 |
| 7,462,036 B2 * | 12/2008 | Shin et al. | ....................... | 439/65 |
| 7,892,022 B2 * | 2/2011 | Mostoller et al. | ............ | 439/507 |
| 8,414,307 B2 * | 4/2013 | Que et al. | ......................... | 439/65 |
| 8,550,838 B2 * | 10/2013 | Osagle et al. | ................. | 439/441 |
| 8,771,004 B2 * | 7/2014 | Fehling et al. | ................ | 439/441 |
| 8,882,533 B2 * | 11/2014 | Brandberg et al. | ........... | 439/441 |
| 2012/0190219 A1 * | 7/2012 | Pai et al. | ......................... | 439/65 |

* cited by examiner

*Primary Examiner* — Gary Paumen
(74) *Attorney, Agent, or Firm* — Greenberg Traurig, LLP

(57) ABSTRACT

A connector for electrically connecting a first printed circuit board (PCB) with a second PCB wherein, in one example, the connector includes a housing having a keyed feature adapted to mate with a correspondingly keyed feature provided to each of the first and second PCBs and at least one connecting terminal carried by the housing having at least partially exposed opposed ends each of which electrically engages a contact pad formed on an underside of the respective PCBs. The connecting terminal may be arranged to accept a conductor and to thereby electrically couple the conductor to the first and second PCBs.

18 Claims, 11 Drawing Sheets

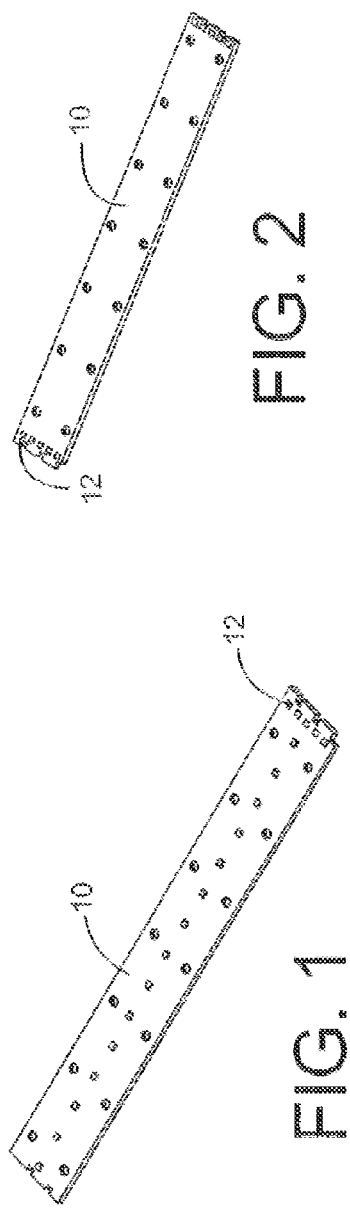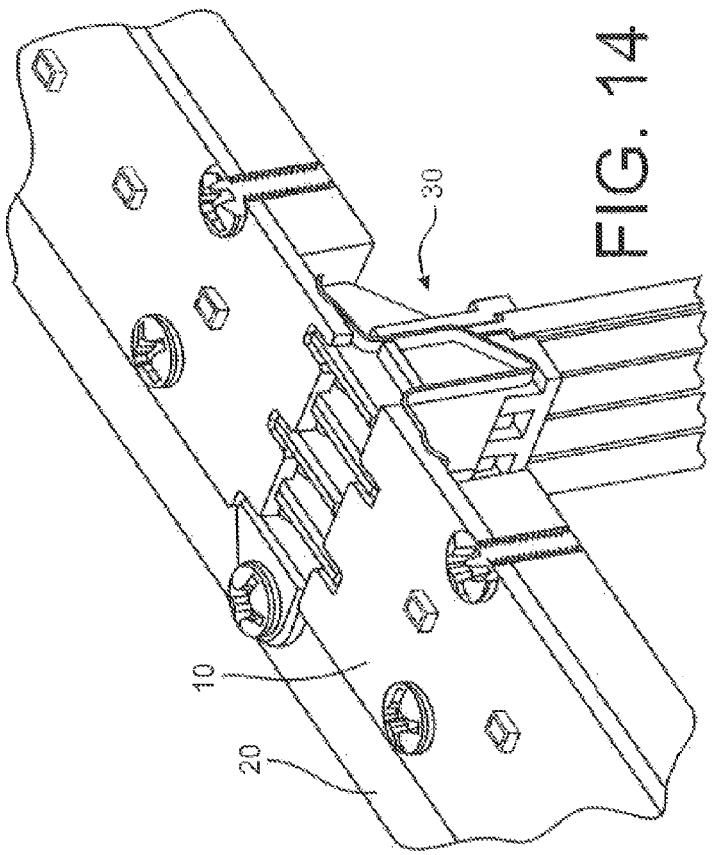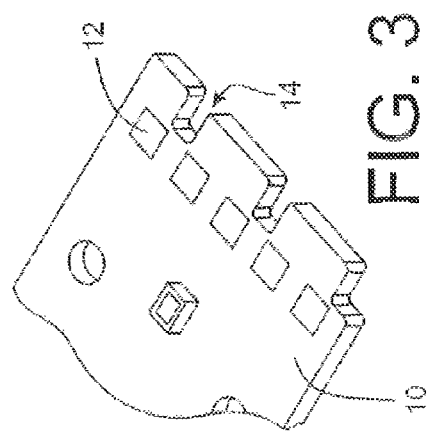

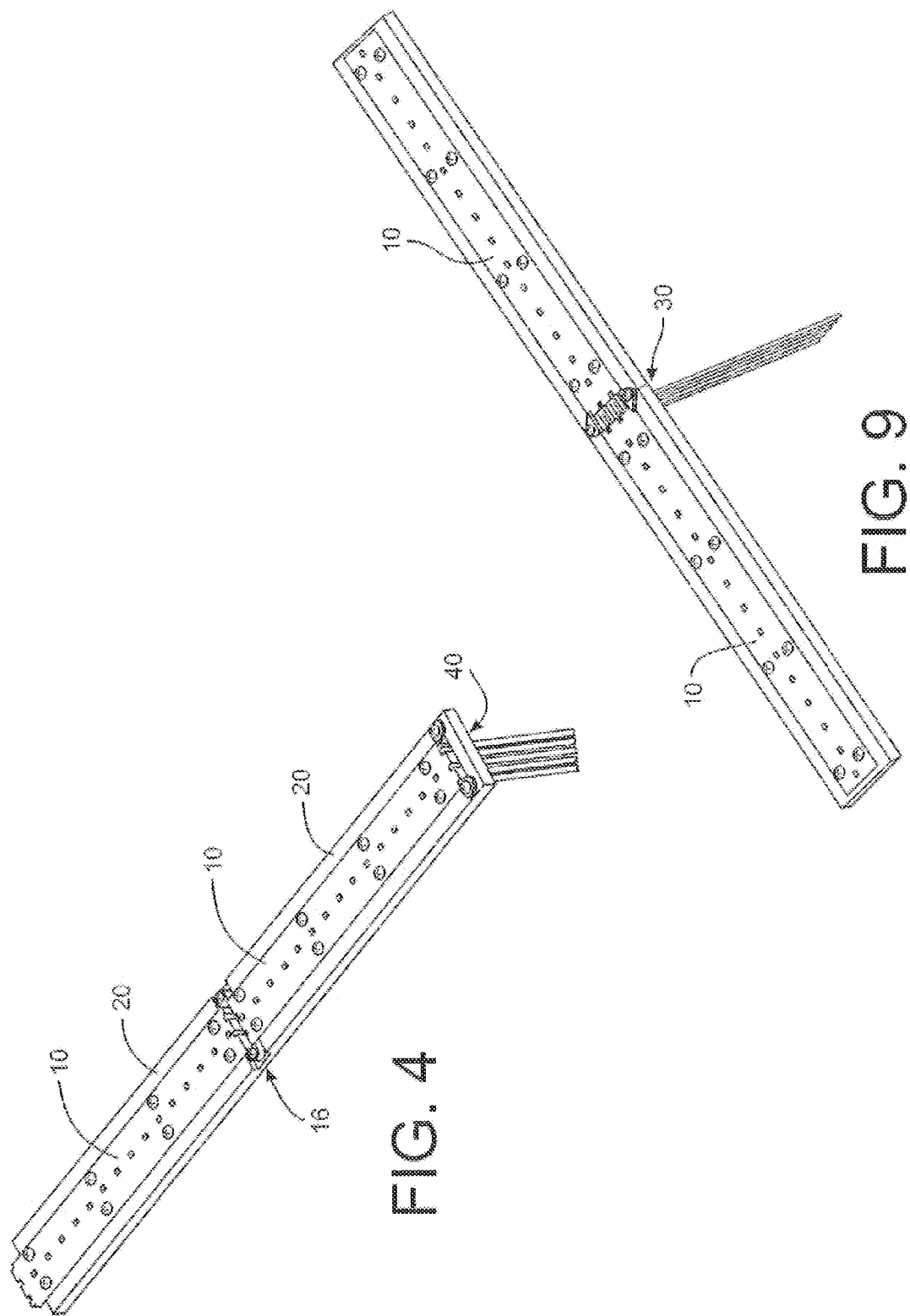

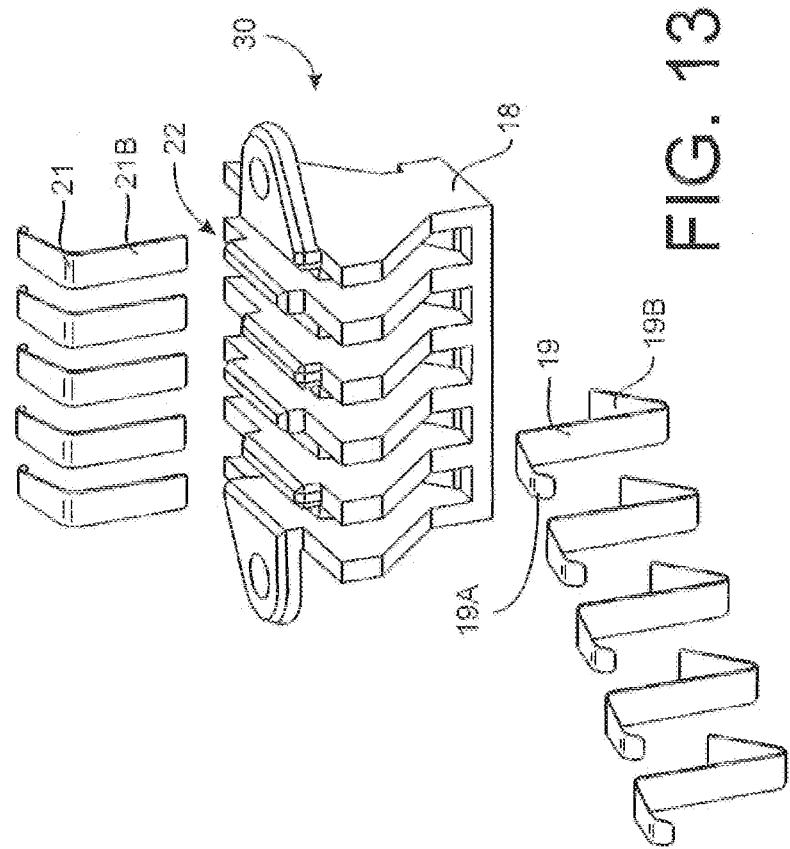
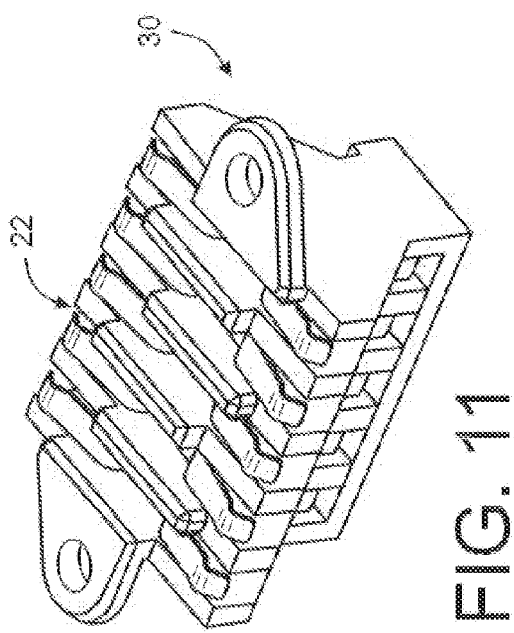
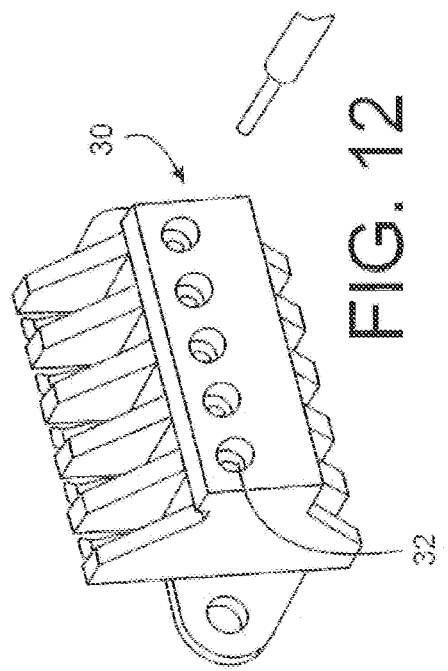

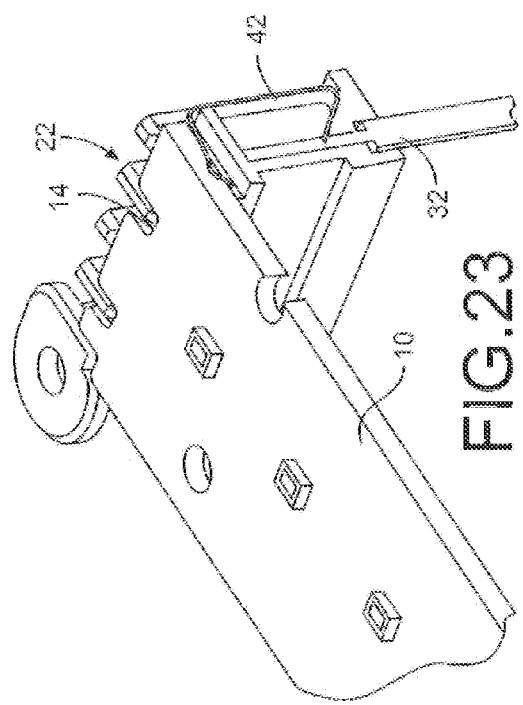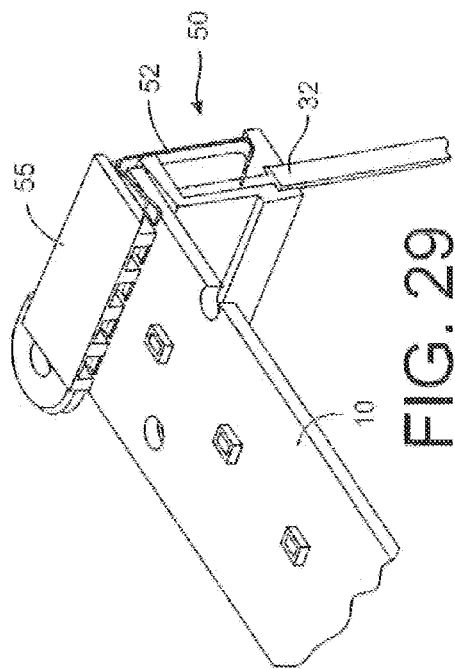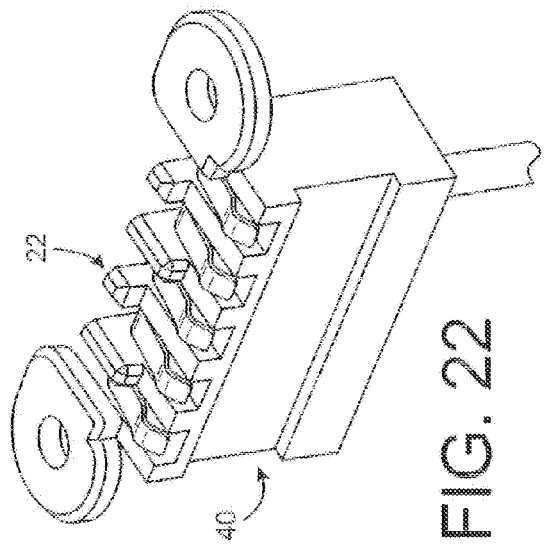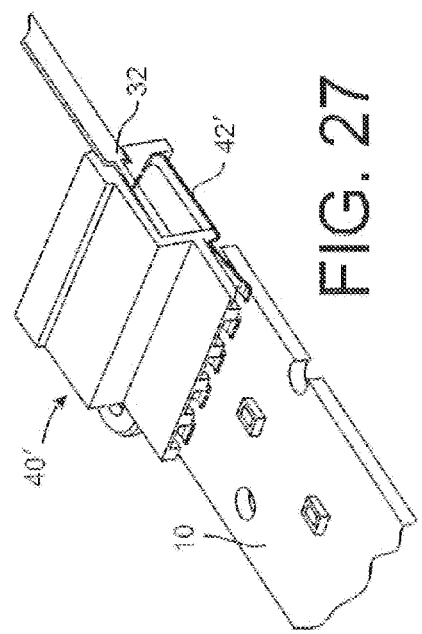

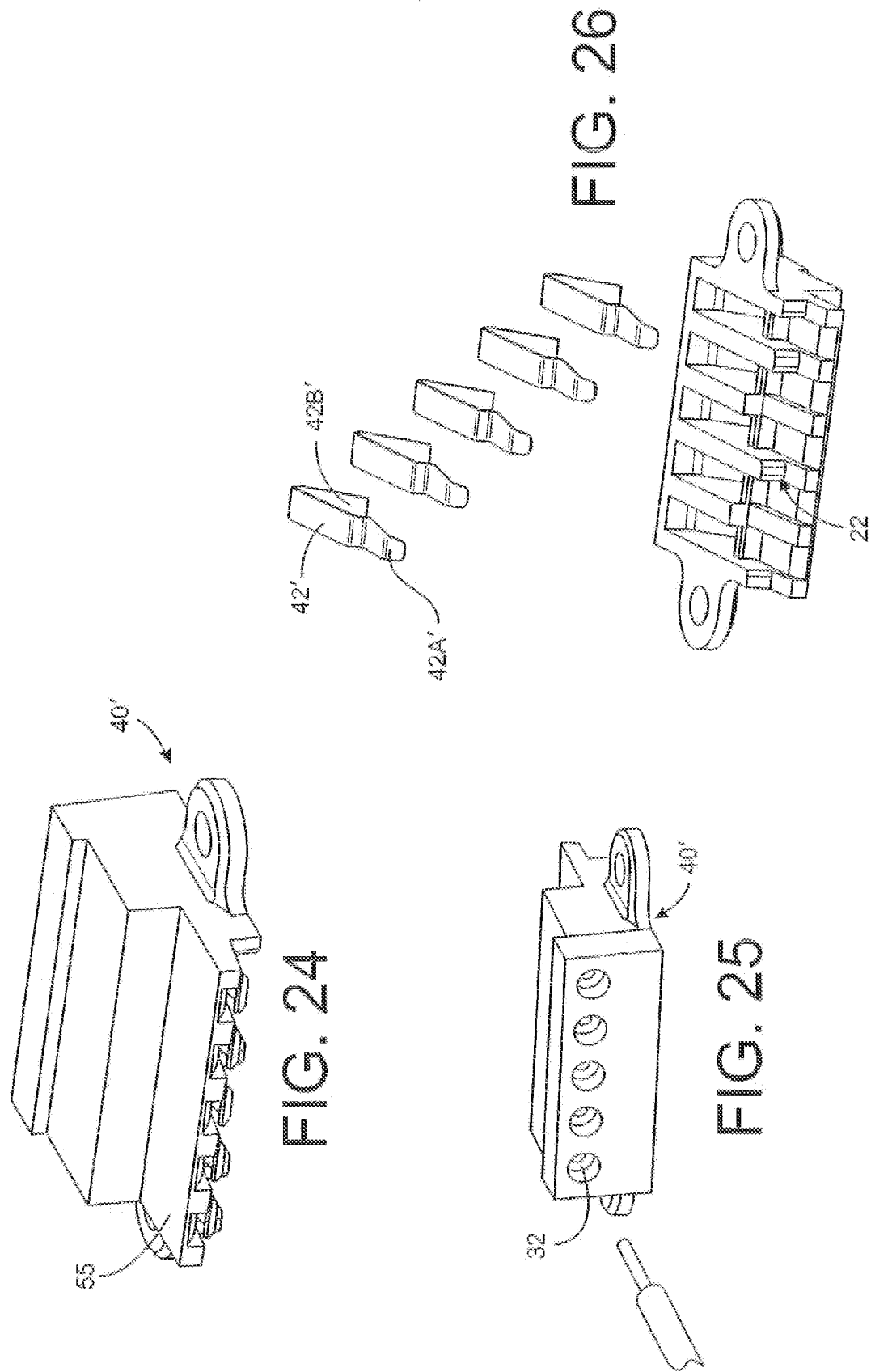

ELECTRICAL CONNECTORS FOR USE WITH PRINTED CIRCUIT BOARDS

CROSS REFERENCE TO RELATED APPLICATION

This application claims the benefit of and is a continuation of U.S. application Ser. No. 13/713,987, filed on Dec. 13, 2012, which application is a non-provisional application claiming priority from U.S. Provisional Application Ser. No. 61/570,506, filed Dec. 14, 2011, entitled "Electrical Connectors for Use with Printed Circuit Boards" each of which is incorporated herein by reference in its entirety.

FIELD OF THE DISCLOSURE

The present description relates generally to electrical connectors and more particularly to electrical connectors for use with printed circuit boards.

BACKGROUND OF RELATED ART

Connectors and more particularly, connectors capable of electrically connecting printed circuit boards ("PCBs") to one another are generally known in the art. For example, U.S. Pat. No. 7,462,036, entitled "Printed Circuit Board Connector for Back Light Unit and Chassis Using the Same," describes a connector for electrically connecting PCBs on which are mounted a plurality of light emitting diodes ("LEDs"). The described connector includes a horizontal supporter, a vertical supporter that divides the horizontal supporter into first and second areas, and at least one connecting terminal formed on the horizontal supporter which is partially exposed in each of the first and second areas of the horizontal supporter. The connecting terminal functions to electrically connect PCBs each having one end placed on the first and second areas, respectively.

U.S. Pat. No. 7,892,022, entitled "Jumper Connector for a Lighting Assembly," also describes a connector for electrically connecting PCBs on which are mounted a plurality of LEDs. The described connector includes a connector body having a mating surface configured to engage more than one PCB. The connector body is configured to be secured to a substrate by a fastener. The connector body additionally includes a conductor and the conductor is configured to be electrically connected to the PCBs during the same step in which the connector body is secured to the substrate. In this manner, the connector body engages the outer surface of the PCBs and simultaneously forces the inner surface of the PCBs into thermal contact with the substrate.

U.S. Published Application No. 2011/0207372, entitled "Electrical Connector With Push-in Termination," describes an edge connector having a first portion adapted to receive an edge of a PCB and a second portion adapted to receive a least one conductor of a stripped end of a wire. The first portion includes at least one terminal assembly and the terminal assembly includes a retention member adapted to engage the conductor via a push-in wire termination. The second portion includes include a terminal portion adapted to releasably engage a contact on a PCB.

While the connectors described in each of these publications, which are incorporated herein by reference in their entirety, generally work for their intended purpose, the following describes improved connectors for use with PCBs. By way of non-limiting example, the improved connectors provide a low profile to reduce or eliminate shadowing of light from any LEDs mounted on the PCBs, allow PCBs to mount directly onto the mounting surface, allow PCBs to be placed adjacent to one another without breaks for continuous lighting, allow for easy replacement of PCBs, eliminate the need to solder together PCBs and connectors, allow wires to be routed from behind a mounting surface such that the wires will not obstruct light from any LEDs mounted on the PCBs, prevent incorrect placement of PCBs within assemblies, etc.

SUMMARY

Described hereinafter are improved connectors for use with PCBs.

More particularly, a connector for electrically connecting a first printed circuit board (PCB) with a second PCB is described wherein the connector includes a housing having a keyed feature that is adapted to mate with a correspondingly keyed feature provided to each of the first and second PCBs and at least one connecting terminal carried by the housing having at least partially exposed opposed ends each of which electrically engages a contact pad formed on an underside of the respective PCBs.

Also described is a connector for electrically connecting a first PCB with a second PCB directly on a mounting surface having a hole, recess, channel, cavity, and/or the like defined therein. The connector includes a housing adapted to be mounted within the cavity of the mounting surface such that the housing does not extend above the mounting surface, and includes at least one connecting terminal carried by the housing having at least partially exposed opposed ends, each of which electrically engages a contact pad formed on an underside of each of the first and second PCBs.

Also described is a connector for electrically connecting a first PCB with a second PCB wherein the connector includes a housing and at least one connecting terminal carried by the housing having at least partially exposed opposed ends each of which electrically engages a contact pad formed on an underside of the respective PCBs and wherein the connector is adapted to allow the edges of the PCBs to be placed into direct contact.

Yet further is described a connector for electrically connecting a first PCB with a second PCB wherein the connector includes a housing and at least one connecting terminal carried by the housing having at least partially exposed opposed ends each of which electrically engages a contact pad formed on an underside or a top side of the respective PCBs and wherein the connecting terminal is arranged to accept a conductor and to thereby electrically couple the conductor to the first and second PCBs.

Still further is described a connector for electrically connecting a PCB with a conductor wherein the connector has a housing having a keyed feature adapted to mate with a correspondingly keyed feature provided to the PCB and at least one connecting terminal carried by the housing having an at least partially exposed opposed end which electrically engages a contact pad formed on an underside or a top side of the PCB wherein an opposite end of the connecting terminal is arranged to cooperate with an interior surface of the housing to engage a conductor inserted therebetween.

Yet further is described a connector for electrically connecting a PCB with a conductor wherein the connector includes a housing and at least one connecting terminal carried by the housing having an at least partially exposed opposed end which electrically engages a contact pad formed on a top side of the PCB and which functions to urge the PCB upon a mounting surface and wherein an opposite end of the connecting terminal is arranged to cooperate with an interior surface of the housing to engage a conductor inserted therebetween.

While the foregoing provides a general description of the subject assemblies for holding a source of LED light and some advantages thereof, a better understanding of the objects, advantages, features, properties, and relationships of the subject assemblies will be obtained from the following detailed description and accompanying drawings which set forth illustrative embodiments and which are indicative of the various ways in which the principles of the invention may be employed.

BRIEF DESCRIPTION OF THE DRAWINGS

For a better understanding of the hereinafter described connectors for use with PCBs, reference may be had to the following drawings.

FIG. 1 illustrates an example printed circuit board having contact pads on a top surface thereof.

FIG. 2 illustrates an example printed circuit board having contact pads on a bottom surface thereof.

FIG. 3 illustrates an end view of the example printed circuit board of FIG. 1.

FIG. 4 illustrates an example center bridge for electrically connecting underside located contact pads of a plurality of printed circuit boards of FIG. 2.

FIG. 9 illustrates an example center bridge having at least one wire insertion port for electrically connecting a wire to underside located contact pads of plural printed circuit boards.

FIG. 11 is an example center bridge for use with the assembly of FIG. 9.

FIG. 12 illustrates the example center bridge of FIG. 11 showing insertion of a wire therein.

FIG. 13 is an exploded view of the center bridge of FIG. 11.

FIG. 14 illustrates the example center bridge of FIG. 9 as installed with a plurality of printed circuit boards.

FIGS. 18-23 illustrate an exemplary edge connector having an underside located wire insertion port for electrically connecting to a wire to an underside contact pad of a printed circuit board;

FIGS. 24-28 illustrate an exemplary edge connector having a side located wire insertion port for electrically connecting a wire to an underside or top side contact pad of a printed circuit board; and FIGS. 29-33 illustrate an exemplary edge connector having an underside located wire insertion port for electrically connecting a wire to a top side contact pad of a printed circuit board.

DETAILED DESCRIPTION

The following description of example methods and apparatus is not intended to limit the scope of the description to the precise form or forms detailed herein. Instead the following description is intended to be illustrative so that others may follow its teachings.

Turning now to the Figures, wherein like elements are referenced using common identifiers, illustrated are various connectors for use with printed circuit boards ("PCBs"). By way of non-limiting example, a PCB 10 may have mounted thereon one or more light emitting diodes ("LEDs") which LEDs are, in turn, electrically coupled to one or more contact pads 12 formed on a top side and/or a bottom side of the PCB 10 as illustrated in FIGS. 1-3. For purposes that will be discussed in greater detail below, ends of the PCB 10 may additionally include one or more keyed features 14. In the illustrated example, the keyed feature 14 comprises a shaped recess formed in the edge of the PCB 10. It will be understood, however, that the shape and positioning of the keyed feature 14 as illustrated in the figures is not intended to be limiting. Rather, it will be understood that keyed feature 14 may be provided with any shape and/or be arranged on the PCB 10 in any manner as needed to meet the objectives described hereinafter. For example, the keyed feature may include a hole defined in the PCB 10 and a corresponding post formed on the connector.

Figure 5:
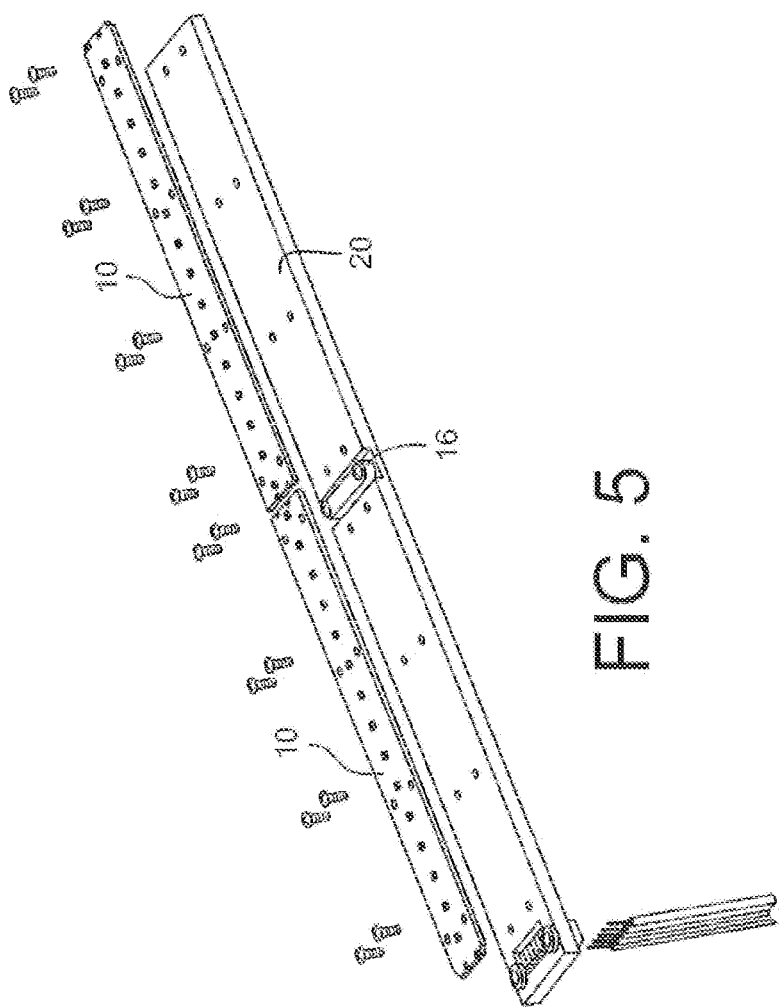
FIG. 5 is an assembly view of the example of FIG. 4.
Figure 10:
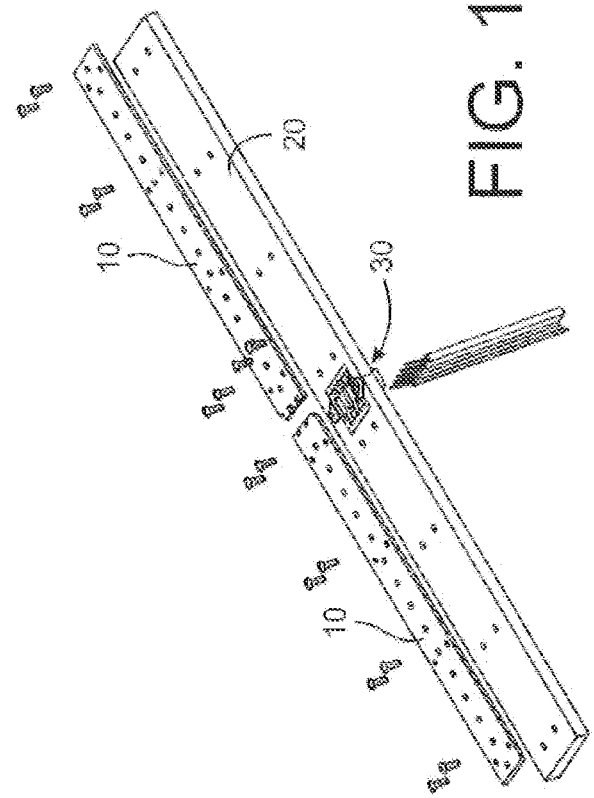
FIG. 10 is an assembly view of the example of FIG. 9.
Figure 6:
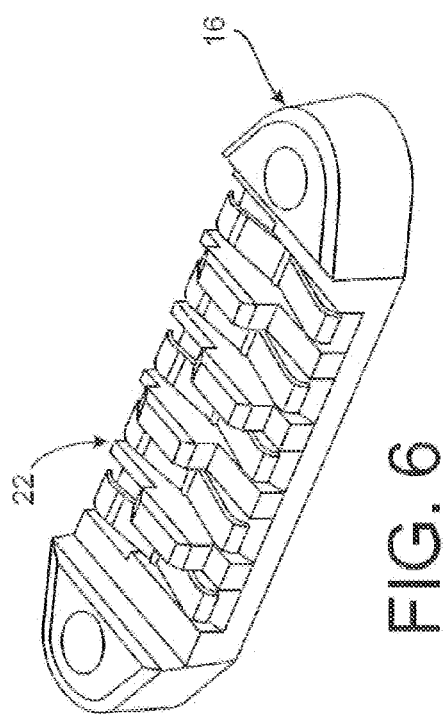
FIG. 6 is an example center bridge for use with the assembly of FIG. 4.
Figure 7:
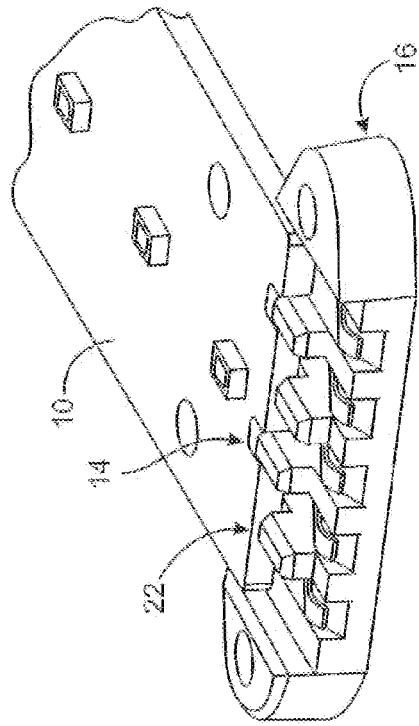
FIG. 7 illustrates the example center bridge of FIG. 6 showing a single printed circuit board connected to the bridge.
Figure 8:
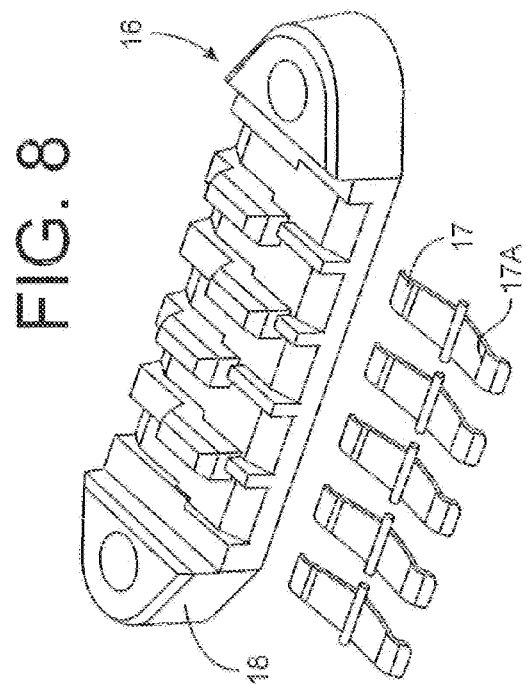
FIG. 8 is an exploded view of the center bridge of FIG. 6.

For providing an electrical connection between two PCBs 10, a center bridge connector 16 is illustrated in FIGS. 4-8. The center bridge connector includes a housing 18 formed using an electrically insulating material, such as plastic. The housing 18 carries one or more connecting terminals 17. Opposite ends of the connecting terminals 17 are arranged to engage contact pads 12 provided on the underside of a PCB 10. For example, as illustrated in FIGS. 4 and 5, the center bridge connector 16 may be mounted in a cavity of a mounting surface 20, e.g., a heat sink, with the PCBs 10 then being mounted to the mounting surface 20 such that an end of each of the PCBs 10 is positioned over a one of the respective, opposite sides of the housing 18 as particularly shown in FIG. 7. Preferably, the connecting terminals 17 have elasticity to thereby facilitate engagement with the contact pads 12 of the PCBs 10, e.g., the ends 17A of the contacting terminals 17 that are exposed in the housing 18 may be curved and arranged over a hole, slot, recess, cavity, or the like as shown in FIG. 8 so that the curved portion of the connecting terminal 17 is elastically moveable. As noted above, the center bridge connector 16 may be positioned in a recess, cavity, or the like formed in the mounting surface 20 to thereby allow the center bridge connector 16 to be positioned generally below the mounting surface to allow the PCBs 10 to lay directly on the mounting surface. As illustrated, the center bridge connector 16 and the PCBs 10 may be mounted to the mounting surface 20 via use of screws, snap-fit, or the like.

To facilitate proper alignment of the PCBs 10 with the connector 16, the housing 18 may optionally carry a keyed feature 22 (an example of which is illustrated in FIGS. 6-8) which is complementary to the keyed feature 14 which may be optionally provided to the PCB 10. In this regard, it is preferred that the keyed features 22 and 18 are arranged to ensure that an edge of a PCB 10 is not incorrectly placed from a given side of the connector 16. It is also preferred that the keyed feature 22 have a low-profile, i.e., a thickness that is no greater than the thickness provided to the PCB 10, to thereby prevent the keyed feature 22 from blocking a path of light emitted from any LEDs mounted on the PCB 10. It will be additionally appreciated that the keyed feature may be used to prevent a PCB 10 with an incorrect rating from being inserted into a lighting fixture. As noted previously, the keyed features 22 and 14 may have any desired cooperable locations and/or shapes without limitation. For example, the keyed feature 14 of the PCBs 10 need not be in the form of one or more slots positioned at an edge of the PCBs 10 but may be in the form of one or more holes provided to a PCB 10 where the holes are arranged and configured to accept a complimentary post or connector provided to the housing 18.

Turning to FIGS. 9-14, a further center bridge connector 30 having one or more conductor insertion ports 32 is illustrated. In the illustrated example, a conductor, e.g., stripped end of wire, it to be inserted into the conductor insertion port 32 whereupon the conductor will be placed into electrical connection with contact pads 12 formed on the underside of PCBs 10 via connecting terminals 19 and 21. More particularly, as illustrated in FIG. 14, the connecting terminals 19 and 21 are arranged to provide wire insertion port 32 with a push-in type electrical connector. To this end, a first end 19B of connecting terminal 19 is provided with a resilient, spring-like member that is arranged to electrically engage a conductor inserted into the conductor insertion port 32 and to thereby drive the inserted conductor into electrical engagement with a first end 21B of the other connecting terminal 21 as shown in FIGS. 13 and 14. As previously described, the second end 19A of the connecting terminal 19 and the second end 21A of the connecting terminal 21, which are exposed from the plastic housing 18 of the center bridge connector 30, are preferably provided with curves to thereby facilitate engagement with the contact pads 12 of the PCBs 10 when the PCBs 10 are positioned over the center bridge connector 30 in the manner shown in FIGS. 9, 10, and 14. When a conductor is not inserted into the wire insertion port 32, the first end 19B of the connecting terminal 19 and the second end 21B of the connecting terminal 21 are preferably electrically engaged—owing to the spring force note previously—to thereby allow the center bridge connector 30 to place the contact pads of the PCBs 10 into electrical communication with one another via the connecting terminals 19 and 21. As before, the housing 18 of the center bridge connector 30 may be provided with low-profile, keyed features 22 and the center bridge connector 30 may be positioned in a recess, cavity, or the like formed in the mounting surface 20 to thereby allow the center bridge connector 30 to be positioned generally below the PCBs 10. While the example illustrated in FIGS. 9-14 disclose a center bridge connector 30 in which the wire insertion port 32 is vertically oriented and located on a side of the center bridge connector 30 that would be opposite of the PCBs 10, it will be appreciated that the described components may be rearranged as needed to facilitate other locations for and/or orientations of the wire insertion port 32 as needed to meet any given connection requirements.

Figure 17:
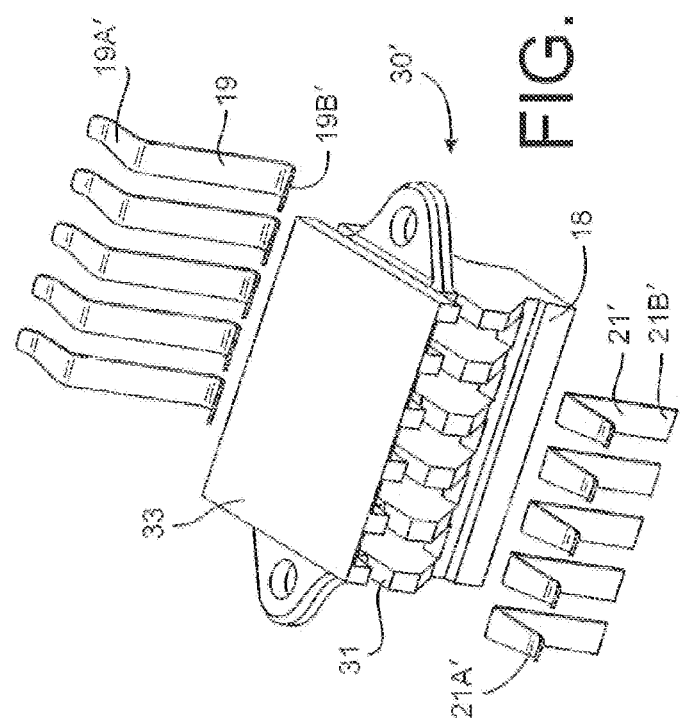
FIGS. 15-17 illustrate a still further exemplary center bridge having at least one wire insertion port for electrically connecting a wire to top side located contact pads of plural printed circuit boards.
Figure 15:
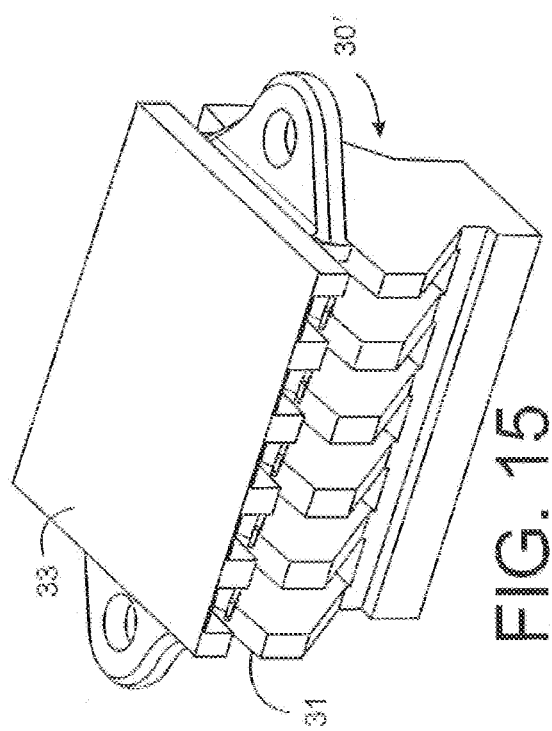
Figure 16:
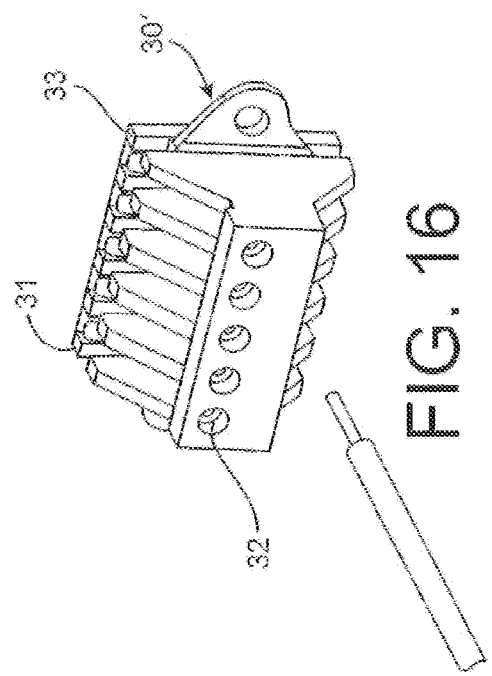
Figure 20:
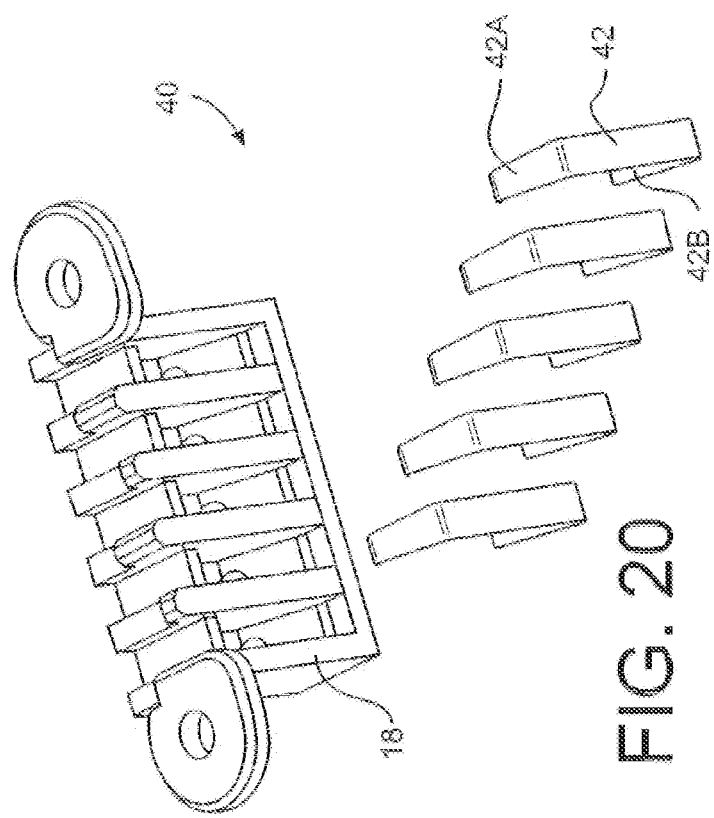
Figure 18:
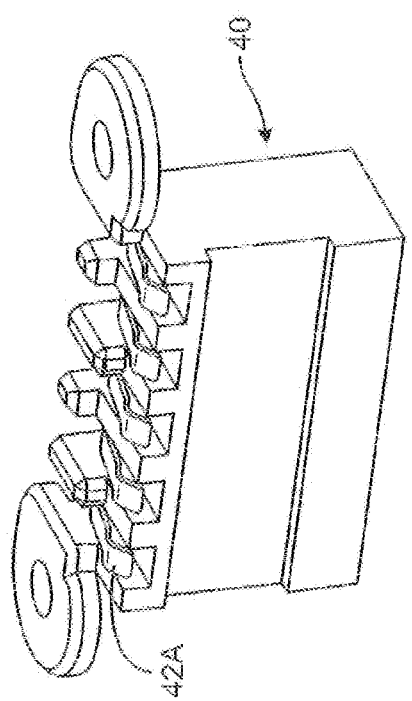
Figure 19:
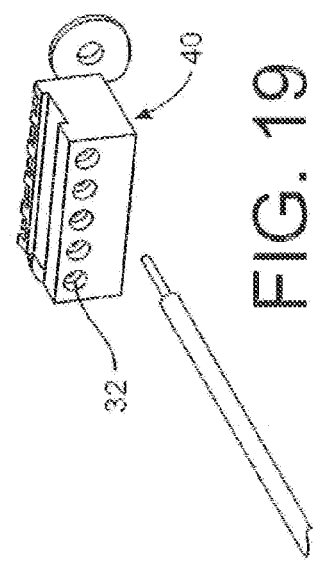
Figure 21:
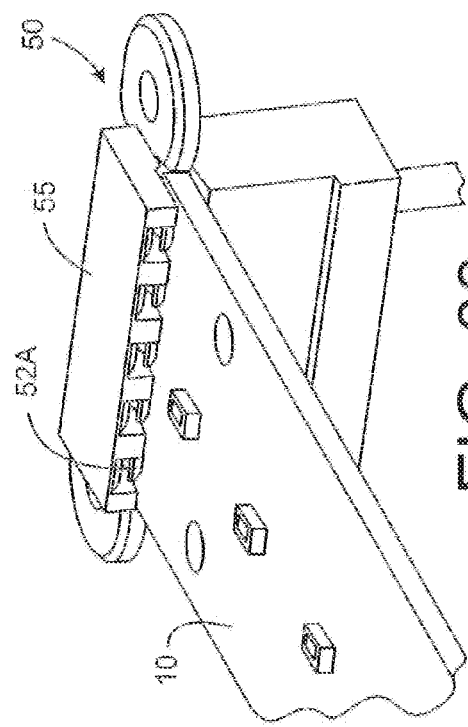
Figure 28:
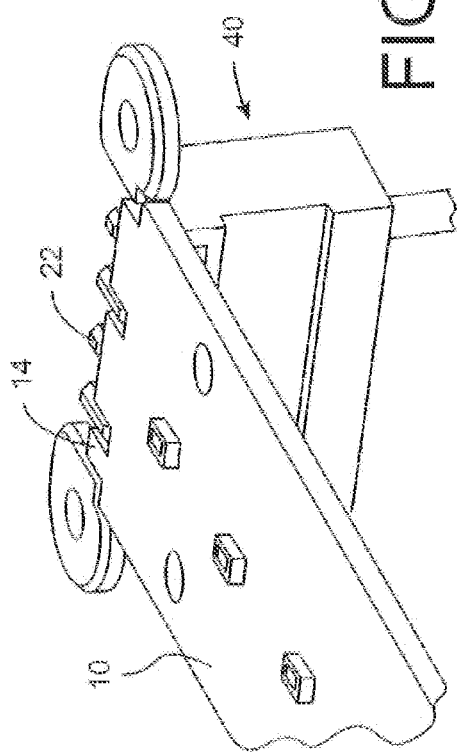
Figure 33:
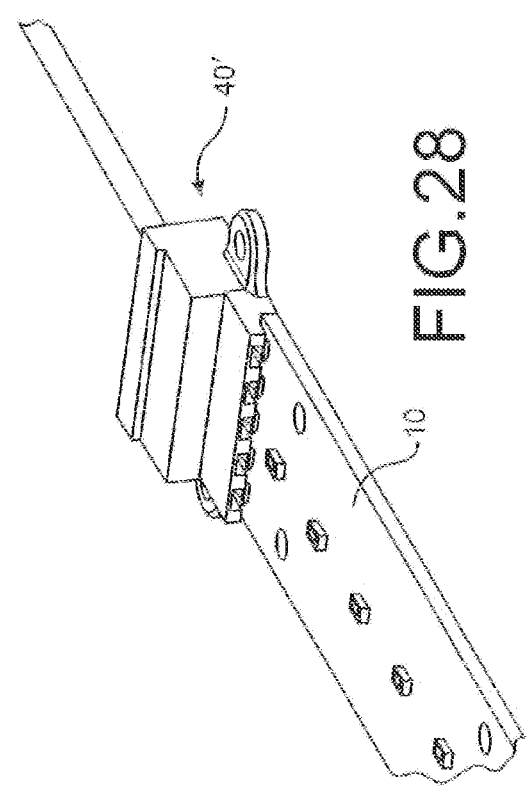
Figure 32:
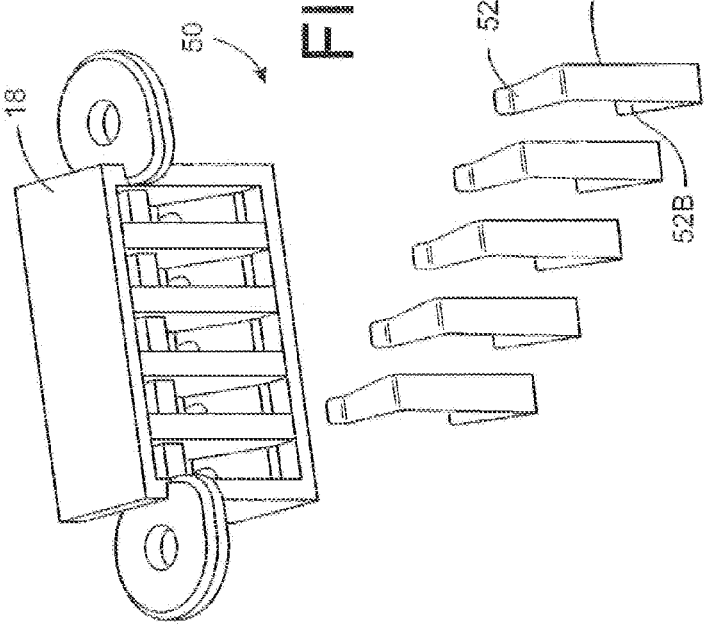
Figure 30:
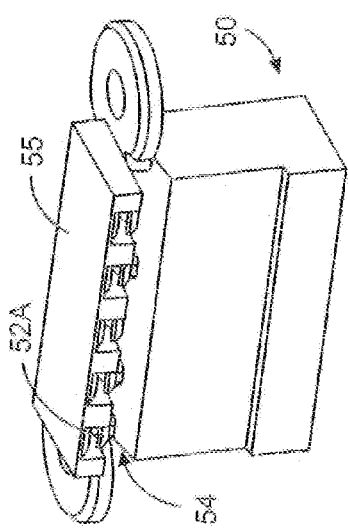
Figure 31:
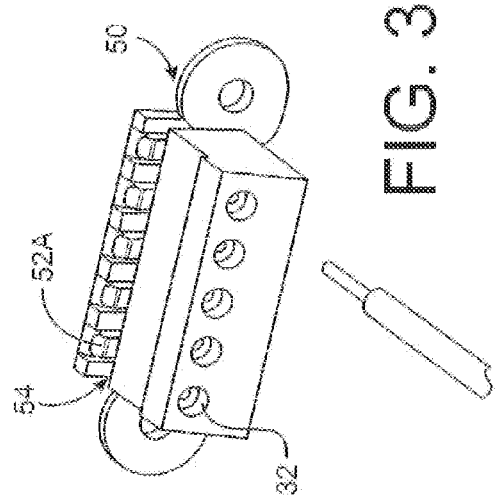

Turning now to FIGS. 15-17, a still further center bridge connector 30' having one or more conductor insertion ports 32 is illustrated. In the illustrated example, a conductor, e.g., stripped end of wire, it to be inserted into the conductor insertion port 32 whereupon the conductor will be placed into electrical connection with contact pads 12 formed on the top side of PCBs 10 via connecting terminals 19' and 21'. As with center bridge connector 30, the connecting terminals 19' and 21' are preferably arranged to provide wire insertion port 32 with a push-in type electrical connector. To this end, a first end 19B' of connecting terminal 19' is provided with a resilient, spring-like member that is arranged to electrically engage a conductor inserted into the conductor insertion port 32 and to thereby drive the inserted conductor into electrical engagement with a first end 21B' of the other connecting terminal 21' as shown in FIG. 17. The second end 19A' of the connecting terminal 19' and the second end 21A' of the connecting terminal 21', which are exposed from the plastic housing 18 of the center bridge connector 30', are preferably provided with downward curves to thereby facilitate engagement with the contact pads 12 located on the top side of the PCBs 10 when the PCBs 10 are positioned within PCB accepting slots 31 formed in the housing 18. As additionally illustrated, the PCB accepting slots 31 are preferably covered by housing section 33 to thereby prevent an inadvertent touching of energized parts such as the top mounted contact pads 12 or connecting terminals 19' and 21' when the PCB 10 is inserted into the center bridge connector 30' as well as the connecting terminals 19' and 21' when the PCB 10 is removed from the PCB accepting slot 31. When a conductor is not inserted into the wire insertion port 32, the first end 19B' of the connecting terminal 19' and the second end 21B' of the connecting terminal 21' are preferably electrically engaged—owing to the spring force note previously—to thereby allow the center bridge connector 30' to place the contact pads of the PCBs 10 into electrical communication with one another via the connecting terminals 19' and 21'. As before, the housing 18 of the center bridge connector 30' may be provided with keyed features 22 (not illustrated). While the example illustrated in FIGS. 15-17 disclose a center bridge connector 30' in which the wire insertion port 32 is vertically oriented and located on a side of the center bridge connector 30' that would be opposite to the PCBs 10, it will be appreciated that the described components may be rearranged as needed to facilitate other locations for and/or orientations of the wire insertion port 32 as needed to meet any given connection requirements.

Turning now to FIGS. 18-23, an edge connector 40 having one or more conductor insertion ports 32 is illustrated. In the illustrated example, a conductor, e.g., stripped end of wire, it to be inserted into the conductor insertion port 32 whereupon the conductor will be placed into electrical connection with a contact pad 12 formed on the underside of a PCB 10 via a connecting terminal 42. More particularly, as illustrated in FIG. 23, the connecting terminal 42 is arranged to cooperate with an interior side of the housing of the edge connector 40 to provide wire insertion port 32 with a push-in type electrical connector. To this end, a first end 42B of the connecting terminal 42 is provided with a resilient, spring-like member that is arranged to electrically engage a conductor inserted into the conductor insertion port 32 and to thereby trap the inserted conductor between the first end 42B of the connecting terminal 42 and the interior side of the housing 18 of the edge connector 40. As previously described, the second end 42A of the connecting terminal 42, which is exposed from the plastic housing 18 of the edge connector 40, is preferably provided with curves to thereby facilitate engagement with the contact pad 12 of the PCB 10 when the PCB 10 is positioned over the edge connector 40 in the manner shown in FIGS. 4, 21, and 23. Similarly, the housing 18 of the edge connector 40 may be provided with low-profile, keyed feature 22 as described above for cooperating with keyed feature 14 provided to the PCB 10.

While the example illustrated in FIGS. 18-23 disclose an edge connector 40 in which the wire insertion port 32 is vertically oriented and located to allow for wire insertions from the underside of the PCB 10, FIGS. 24-28 illustrate an edge connector 40' in which the wire insertion port 32 is horizontally oriented and located to allow for wire insertions from a side of the PCB 10. The edge connector 40' includes the same components as those described above with respect to edge connector 40 with the components being oriented and arranged to accommodate wire insertion from the side of the PCB 10. The edge connector 40' can be used to engage contact pads 12 located on the top side or the underside of a PCB 10. In the illustrated embodiment, the housing of the edge connector 40' includes a housing section 55 to thereby prevent an inadvertent touching of energized parts such as the top mounted contact pads 12 or connecting terminal 42' when the PCB 10 is inserted under the connecting terminal 42' as well as the connecting terminal 42' when the PCB 10 is removed therefrom. It will also be appreciated that the curves provided to the connecting terminal 42' may function to urge the PCB 10 into engagement with the mounting surface 20 when used to engage a top side contact pad 12 of a PCB 10. Similarly, when used to engage a top side contact pad 12 of a PCB 10, the top portion of the edge connector 40' is desired to have a height that will minimize the blocking of light emitted from any LEDs mounted on the PCB 10.

Turning now to FIGS. 29-33, a further edge connector 50 having one or more conductor insertion ports 32 is illustrated. In the illustrated example, a conductor, e.g., stripped end of wire, it to be inserted into the conductor insertion port 32 whereupon the conductor will be placed into electrical connection with a contact pad 12 formed on the upper side of a PCB 10 via a connecting terminal 52. More particularly, as illustrated in FIG. 29, the connecting terminal 52 is arranged to cooperate with an interior side of the housing of the edge connector 50 to provide wire insertion port 32 with a push-in type electrical connector. To this end, a first end 52B of the connecting terminal 52 is provided with a resilient, spring-like member that is arranged to electrically engage a conductor inserted into the conductor insertion port 32 and to thereby trap the inserted conductor between the first end 52B of the connecting terminal 52 and the interior side of the housing 18 of the edge connector 50. As previously described, the second end 52A of the connecting terminal 52, which is exposed from the plastic housing 18 of the edge connector 50, is preferably provided with downward curves to thereby facilitate engagement with the contact pad 12 of the PCB 10 when the PCB 10 is positioned within insertion opening 54 as particularly illustrated in FIGS. 29 and 33. In this regard, the PCB insertion opening 54 is preferably covered by housing section 55 to thereby prevent an inadvertent touching of energized parts such as the top mounted contact pads 12 or connecting terminal 52 when the PCB 10 is inserted into the edge connector 50 as well as the connecting terminal 52 when the PCB 10 is removed therefrom. It will also be appreciated that the curves provided to the connecting terminal 52 may function to urge the PCB 10 into engagement with the mounting surface 20, i.e., the lower surface of the PCB insertion slot 54 would be lower than the top of the PCB 10. Preferably, the top portion of the edge connector 50 is provided with a height to minimize the blocking of light emitted from any LEDs mounted on the PCB 10. The insertion opening 54 may also be provided with keyed features (not shown) for the purposes described previously.

While specific embodiments of the subject invention have been described in detail, it will be appreciated by those skilled in the art that various modifications and alternatives to those details could be developed in light of the overall teachings of this disclosure. For example, it is to be appreciated that features described with respect to the various embodiments are not to be limited to any particular embodiment but may be freely used across embodiments where applicable. Yet further, while discussed with respect to examples involving PCBs carrying LEDs, it will be understood that the disclosed electrical connectors could be incorporated into other electrical apparatus and systems. Still further, it will be appreciated that the size, shape, arrangement, and/or number of components illustrated and described can be changed as necessary to meet a given need. Accordingly, the particular arrangements disclosed are meant to be illustrative only and not limiting as to the scope of the invention which is to be given the full breadth of the appended claims and any equivalents thereof.

What is claimed is:

1. A connector for electrically connecting a printed circuit board (PCB) with a conductor, comprising:
   a housing, adapted for removable connection with the PCB, having a first side and a second side, the second side having an opening; and
   at least one connecting terminal carried by the housing having an at least partially exposed end that is substantially oriented in a direction that is generally parallel to the first side of the housing to provide a surface portion for releasably and electrically engaging a contact pad formed on a side of the PCB facing the first side of the housing when the housing is removably connected to the PCB;
   wherein an opposite end of the connecting terminal is arranged within the housing to grasp an end of an electrical wire when inserted into the opening in the second side of the housing.

2. A connector as recited in claim 1, wherein the housing further comprises a keyed feature adapted to mate with a correspondingly keyed feature provided to the PCB.

3. A connector as recited in claim 1, wherein the connector is adapted to be snap fit to a mounting surface.

4. A connector as recited in claim 1, wherein the housing is size and arranged to not extend above a top surface of the PCB when connected with the PCB.

5. A connector as recited in claim 1, wherein the at least partially exposed end of the at least one connecting terminal carried by the housing is arranged to urge the PCB upon a mounting surface.

6. A connector as recited in claim 5, wherein the connector is adapted to be snap fit to the mounting surface.

7. A connector as recited in claim 5, wherein the housing has a keyed feature adapted to mate with a correspondingly keyed feature provided to the PCB.

8. A connector as recited in claim 5, wherein the housing has a portion that functions to protect against inadvertent touching of the contact pad formed on a top side of the PCB.

9. A connector as recited in claim 5, wherein the housing further comprises a covering to at least partially cover the connecting terminal to prevent inadvertent contact therewith.

10. A connector for electrically connecting a printed circuit board (PCB) with a conductor, comprising:
    a housing, adapted for removable connection with the PCB, having a first side and a second side, the second side having an opening; and
    at least one connecting terminal carried by the housing having an at least partially exposed end that is arranged on the first side of the housing to releasably and electrically engage a contact pad formed on a side of the PCB;
    wherein an opposite end of the connecting terminal is arranged within the housing to grasp an end of an electrical wire when inserted into the opening in the second side of the housing and wherein the housing further comprises a keyed feature adapted to mate with a correspondingly keyed feature provided to the PCB.

11. A connector as recited in claim 10, wherein the connector is adapted to be snap fit to a mounting surface.

12. A connector as recited in claim 10, wherein the housing is size and arranged to not extend above a top surface of the PCB when connected with the PCB.

13. A connector as recited in claim 10, wherein the at least partially exposed end of the at least one connecting terminal carried by the housing is arranged to urge the PCB upon a mounting surface.

14. A connector as recited in claim 13, wherein the connector is adapted to be snap fit to the mounting surface.

15. A connector as recited in claim 13, wherein the housing has a portion that functions to protect against inadvertent touching of the contact pad formed on a top side of the PCB.

16. A connector as recited in claim 13, wherein the housing further comprises a covering to at least partially cover the connecting terminal to prevent inadvertent contact therewith.

17. A connector for electrically connecting a printed circuit board (PCB) with a conductor, comprising:
- a housing, adapted for removable connection with the PCB, having a first side and a second side, the second side having an opening; and
- at least one connecting terminal carried by the housing having an at least partially exposed end that is arranged on the first side of the housing to releasably and electrically engage a contact pad formed on a side of the PCB;
- wherein an opposite end of the connecting terminal is arranged within the housing to grasp an end of an electrical wire when inserted into the opening in the second side of the housing and wherein the housing has a portion that functions to protect against inadvertent touching of the contact pad formed on a top side of the PCB.

18. A connector as recited in claim 17, wherein the portion comprises a covering to at least partially cover the connecting terminal.

* * * * *